(12) United States Patent
Deshpande et al.

(10) Patent No.: US 11,950,386 B2
(45) Date of Patent: Apr. 2, 2024

(54) EXPLOSION PROOF FEED-THROUGH

(71) Applicant: MICRO MOTION, INC., Boulder, CO (US)

(72) Inventors: Atul Vasant Deshpande, Pune (IN); Clayton T. James, Longmont, CO (US); Shaun E. Shanahan, Denver, CO (US); Howard Irving Sohm, Jr., Longmont, CO (US)

(73) Assignee: MICRO MOTION, INC., Boulder, CO (US)

( * ) Notice: Subject to any disclaimer, the term of this patent is extended or adjusted under 35 U.S.C. 154(b) by 657 days.

(21) Appl. No.: 17/261,393

(22) PCT Filed: Aug. 9, 2018

(86) PCT No.: PCT/US2018/045901
§ 371 (c)(1),
(2) Date: Jan. 19, 2021

(87) PCT Pub. No.: WO2020/032946
PCT Pub. Date: Feb. 13, 2020

(65) Prior Publication Data
US 2021/0352816 A1 Nov. 11, 2021

(51) Int. Cl.
*G01F 1/84* (2006.01)
*G01F 15/14* (2006.01)
*H05K 5/02* (2006.01)
*H05K 5/06* (2006.01)

(52) U.S. Cl.
CPC ........... *H05K 5/064* (2013.01); *G01F 1/8409* (2013.01); *G01F 15/14* (2013.01); *H05K 5/0217* (2013.01)

(58) Field of Classification Search
None
See application file for complete search history.

(56) References Cited

U.S. PATENT DOCUMENTS 7,634,939 B2 * 12/2009 Drahm ................. G01F 1/8431
73/54.25
8,113,064 B2 * 2/2012 Huber .................. G01F 1/8431
73/861.357

(Continued)

FOREIGN PATENT DOCUMENTS

JP 2007068397 A 3/2007
KR 101270100 B1 5/2013

(Continued)

*Primary Examiner* — Xanthia C Relford
(74) *Attorney, Agent, or Firm* — The Ollila Law Group LLC

(57) ABSTRACT

An explosion proof electronics enclosure (200), is provided having a first compartment (206) and a second compartment (207) defined by a body (205). A septum (208) is between the first compartment (206) and the second compartment (207). A first aperture (209) in the septum (208) connects the first compartment (206) and the second compartment (207). A cavity (225) communicates with the first aperture (209), wherein the cavity (225) comprises an undercut taper (226). A potting (230) in the cavity (225) conforms to the cavity (225) shape, and forms a substantially explosion-proof interface between the first compartment (206) and the second compartment (207).

15 Claims, 3 Drawing Sheets

(56) References Cited

U.S. PATENT DOCUMENTS

| | | | | |
|---|---|---|---|---|
| 8,161,812 B1 * | 4/2012 | Fischer | | G01F 15/185 |
| | | | | 73/261 |
| 9,506,752 B2 * | 11/2016 | Kuo | | H02B 1/28 |
| 9,807,896 B2 * | 10/2017 | Arai | | H05K 7/1462 |
| 9,891,082 B2 * | 2/2018 | Hausler | | H05K 7/1462 |
| 11,073,416 B2 * | 7/2021 | Drahm | | G01F 1/8413 |
| 2008/0045923 A1 | 2/2008 | Tashjian | | |
| 2011/0171497 A1 * | 7/2011 | McGuire | | H01R 33/945 |
| | | | | 429/7 |
| 2011/0317390 A1 * | 12/2011 | Moser | | G01D 11/245 |
| | | | | 361/679.01 |
| 2015/0028730 A1 * | 1/2015 | Loeffel | | G01D 11/24 |
| | | | | 220/377 |
| 2015/0135852 A1 * | 5/2015 | Efimov | | G01F 1/115 |
| | | | | 73/861.78 |
| 2016/0123755 A1 * | 5/2016 | Gambera | | B60W 40/09 |
| | | | | 701/70 |
| 2017/0030755 A1 * | 2/2017 | Grewal | | G01F 1/662 |
| 2018/0249587 A1 * | 8/2018 | Seiler | | H05K 7/1462 |
| 2019/0376831 A1 * | 12/2019 | Rieder | | G01F 1/8409 |

FOREIGN PATENT DOCUMENTS

| | | |
|---|---|---|
| WO | 2013172846 A1 | 11/2013 |
| WO | 2016048324 A1 | 3/2016 |

\* cited by examiner

EXPLOSION PROOF FEED-THROUGH

BACKGROUND OF THE INVENTION

1. Field of the Invention

The present invention relates to electronics housings, and more particularly, to an explosion proof electronics enclosure having an explosion proof feed-through.

2. Statement of the Problem

Some industrial environments have an explosive atmosphere. A spark of sufficient energy in these environments can ignite an explosion. One potential source of these sparks is circuitry used to perform and monitor certain operations in these environments. Some electronic devices, such as industrial measuring instruments for example, may generate an electrostatic discharge or spark during their operation. In dangerous atmospheres, it is important to enclose such circuits in an explosion proof compartment to prevent a spark created inside the compartment from igniting the atmosphere outside of the compartment.

It is a problem, however, to extend connections from such circuits inside the explosion proof compartment to terminals outside the compartment. In order to extend the connections from these circuits to the terminals, a feedthrough connector must pass through a wall in the explosion proof compartment without compromising the integrity of the compartment. There are two main types of feedthrough connectors which are commonly used with explosion proof compartments. The first feedthrough connector type comprises a plurality of conductors that are potted into a wall of the compartment. The second type is a cylindrical feedthrough connector that is threaded or slip fitted into an opening in the compartment. Both of these feedthrough connector types have several disadvantages associated with their use.

One disadvantage of potting conductors in a wall of an explosion proof compartment is that it is a difficult process to properly pot the conductors. The conductors, which are typically wires, must be held in place while a potting material is injected into the wall of the compartment and cured. Any movement of the conductors before the potting material is cured results in the conductors being improperly set. Extra time and equipment are required to ensure that the conductors are properly set.

Another disadvantage of potting conductors into a wall of the compartment is that there are limited housing configurations which permit an easy connection of conductors with circuits inside the compartment. In order to facilitate a connection with the internal circuits, the conductors must be in easily accessible areas of the compartment. The placement of the conductors in accessible areas is a limiting factor in the manufacture of such a compartment.

A cylindrical feedthrough connector is threaded or slip fitted into a mated opening in an explosion proof compartment. Several disadvantages of a cylindrical feedthrough connector can be attributed to the type of conductor used in the feedthrough. Typically, discrete wires or solid conductors, such as pins, are used as the conductors in cylindrical feedthrough connectors.

A disadvantage of discrete wires in the cylindrical feedthrough connector is that the discrete wires do not facilitate automated production techniques. Each discrete wire must be attached to a terminal or other type of connector in an explosion proof compartment. This adds to the hardware needed inside the explosion proof compartment. Further, the connection of the discrete wires to the terminals is labor intensive.

Industrial measuring instruments, such as flowmeters, are often operated in locations in which there is a danger of explosion, i.e., the electronic apparatus is located not in normal air, but in a potentially explosive atmosphere. Examples of environments in which potentially explosive atmospheres are present or may arise are refueling facilities, hydrocarbon capture or transfer facilities, or chemical plants, for example.

Such electronic apparatuses that are to be usable in hazardous areas are subject to special safety regulations, which are defined in a number of operational standards. The main objects of those standards are to avoid an electric spark that may initiate an explosion, or to prevent a spark produced inside an enclosed space from causing an explosion outside, or to ensure that a flame that has already developed will be confined to the space in which it has developed. By way of example only, European Standards EN 50014 and EN 50018, or EN 60079-1, describe the requirements for electronics devices necessary to be considered an "explosion proof enclosure" (Ex-d). Ideally, in the event of a fault or a short circuit, the maximum amount of energy released is not sufficient to produce a spark capable of causing ignition. These are examples of some European standards, and are provided as an example only, but comparable standards exist in the USA, Canada, Japan, and other countries.

In particular, electronic apparatuses designed to meet the requirements of Ex-d protection must be located in a portion of an enclosure that is explosion proof. This prevents an explosion that occurs inside the enclosure from penetrating to the outside or to another compartment, e.g., from the electronics compartment to the terminal compartment.

Flowmeters, such as Coriolis mass flowmeters and vibrating densitometers, typically operate by detecting motion of a vibrating conduit that contains a flowing material. Properties associated with the material in the conduit, such as mass flow, density and the like, can be determined by processing measurement signals received from motion transducers associated with the conduit. The vibration modes of the vibrating material-filled system generally are affected by the combined mass, stiffness and damping characteristics of the containing conduit and the material contained therein.

A typical Coriolis mass flowmeter includes one or more conduits that are connected inline in a pipeline or other transport system and convey material, e.g., fluids, slurries, emulsions, and the like, in the system. Each conduit may be viewed as having a set of natural vibration modes, including for example, simple bending, torsional, radial, and coupled modes. In a typical Coriolis mass flow measurement application, a conduit is excited in one or more vibration modes as a material flows through the conduit, and motion of the conduit is measured at points spaced along the conduit. Excitation is typically provided by an actuator, e.g., an electromechanical device, such as a coil-type driver, that perturbs the conduit in a periodic fashion. Mass flow rate may be determined by measuring time delay or phase differences between motions at the transducer locations. Two such transducers (or pickoff sensors) are typically employed in order to measure a vibrational response of the flow conduit or conduits, and are typically located at positions upstream and downstream of the actuator. The two pickoff sensors are connected to electronic instrumentation. The instrumentation receives signals from the two pickoff sensors and processes the signals in order to derive a mass flow rate measurement, among other things.

For flowmeters, by way of example, an explosion proof physical barrier may separate the compartments of a field-mount transmitter housing. Process control transmitters designed for use in hazardous atmospheres often utilize a combination of protection methods, including explosion proof housings and/or barriers, to avoid uncontrolled explosions of flammable gases. In the case of Coriolis flowmeter transmitters, it is well known to enclose the active electronics components within an explosion proof compartment, so that an explosion of gases that might occur as a result of electrical energy within the electronics will not propagate beyond the enclosure. Furthermore, it is sometimes preferred that user-accessible connection facilities of the electronics utilize "increased safety" rather than explosion proof as a protection method, wherein the connection facilities are shown to be non-sparking and therefore incapable of igniting a flammable gas. Under either standard, active electronics which could cause ignition are contained in a compartment wherein any ignition within the compartment cannot escape the compartment.

In order to provide electrical connectivity between the two compartments, an explosion proof feed-through is employed. A common prior art explosion proof feed-through is a cemented joint bushing. In a cemented joint bushing, a cemented joint may be formed between the conductors and the bushing casing or a cemented joint may be formed between a conductor insulation layer and the bushing casing. In a non-cemented joint, a small-tolerance interface may be used between the bushing casing and compartment wall, including joint interfaces to threaded, spigot, and other bushing casings. In order to be approved as explosion proof, both types of joints must meet specific requirements, such as a temperature index rating and chemical compatibility for a cemented joint, exceedingly tight tolerances for a cylindrical joint (such as on the order of 0.1 or 0.15 millimeter, for example), and thread count, depth, and tolerance for a threaded joint.

An explosion proof electronics enclosure having a feed-through is provided according to embodiments for use with electronics devices, such as flowmeters, that may be employed in environments susceptible to explosion.

SUMMARY

According to an embodiment, an explosion proof electronics enclosure, is provided. The explosion proof feed-through comprises a first compartment defined by a body, a second compartment defined by the body, and a septum between the first compartment and the second compartment. A first aperture with the septum connects the first compartment and the second compartment. A cavity, in communication with the first aperture, comprises an undercut taper. A potting with the cavity conforms to the cavity shape and forms a substantially explosion-proof interface between the first compartment and the second compartment.

A method of forming an explosion proof electronics enclosure is provided according to an embodiment. The method comprises providing a feed-through body comprising a first compartment and a second compartment. The first compartment and the second compartment are separated with a septum. A first aperture is placed in the septum that connects the first compartment and the second compartment. A cavity is provided in communication with the first aperture, wherein the cavity comprises an undercut taper, and wherein a maximally undercut portion of the undercut taper is proximate the first compartment. Potting is placed in the cavity, such that the potting conforms to the cavity shape, and forms a substantially explosion-proof interface between the first compartment and the second compartment.

Aspects

According to an aspect, an explosion proof electronics enclosure comprises a first compartment defined by a body, a second compartment defined by the body, and a septum between the first compartment and the second compartment. A first aperture with the septum connects the first compartment and the second compartment. A cavity, in communication with the first aperture, comprises an undercut taper. A potting with the cavity conforms to the cavity shape and forms a substantially explosion-proof interface between the first compartment and the second compartment.

Preferably, a feed-through element comprises a first interface region and a second interface region, wherein one or more conductors extend between the first interface region and the second interface region, and wherein the first interface region resides in the first compartment, and the second interface region resides in the second compartment. The potting retains the feed-through element in the cavity and the first aperture.

Preferably, the feed-through element comprises a printed circuit board.

Preferably, a cross section of the cavity comprises a dovetail shape.

Preferably, a cross section of the cavity comprises a frustoconical shape.

Preferably, a support plate is disposed in the cavity, wherein the support plate comprises a second aperture therein, and wherein the support plate aids retaining the potting during an explosion.

Preferably, the support plate is configured to maintain a feed-through element in a predetermined position in the first aperture and cavity.

Preferably, a cross section of the undercut comprises an undercut angle between 15° and 25°.

According to an aspect, a method of forming an explosion proof electronics enclosure comprises providing a feed-through body comprising a first compartment and a second compartment. The first compartment and the second compartment are separated with a septum. A first aperture is placed in the septum that connects the first compartment and the second compartment. A cavity is provided in communication with the first aperture, wherein the cavity comprises an undercut taper, and wherein a maximally undercut portion of the undercut taper is proximate the first compartment. Potting is placed in the cavity, such that the potting conforms to the cavity shape, and forms a substantially explosion-proof interface between the first compartment and the second compartment.

Preferably, the method comprises inserting a feed-through element through the first aperture and cavity, wherein the feed-through element comprises a first interface region and a second interface region, wherein one or more conductors extend between the first interface region and the second interface region, and wherein the first interface region resides in the first compartment, and the second interface region resides in the second compartment. The feed-through element is retained in the cavity and the first aperture with the potting.

Preferably, the method comprises shaping a cross section of the cavity to comprise a dovetail shape.

Preferably, the method comprises shaping a cross section of the cavity to comprise a frustoconical shape.

Preferably, the method comprises forming a second aperture in a support plate, and placing the support plate in the cavity, wherein the support plate aids retaining the potting during an explosion.

Preferably, the method comprises installing a feed-through element through the second aperture of the support plate, and maintaining a feed-through element in a predetermined position in the first aperture and cavity with the support plate.

Preferably, the feed-through element is installed through the second compartment.

DESCRIPTION OF THE DRAWINGS

The same reference number represents the same element on all drawings. The drawings are not necessarily to scale.

DETAILED DESCRIPTION

FIGS. 1-4 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Figure 1:
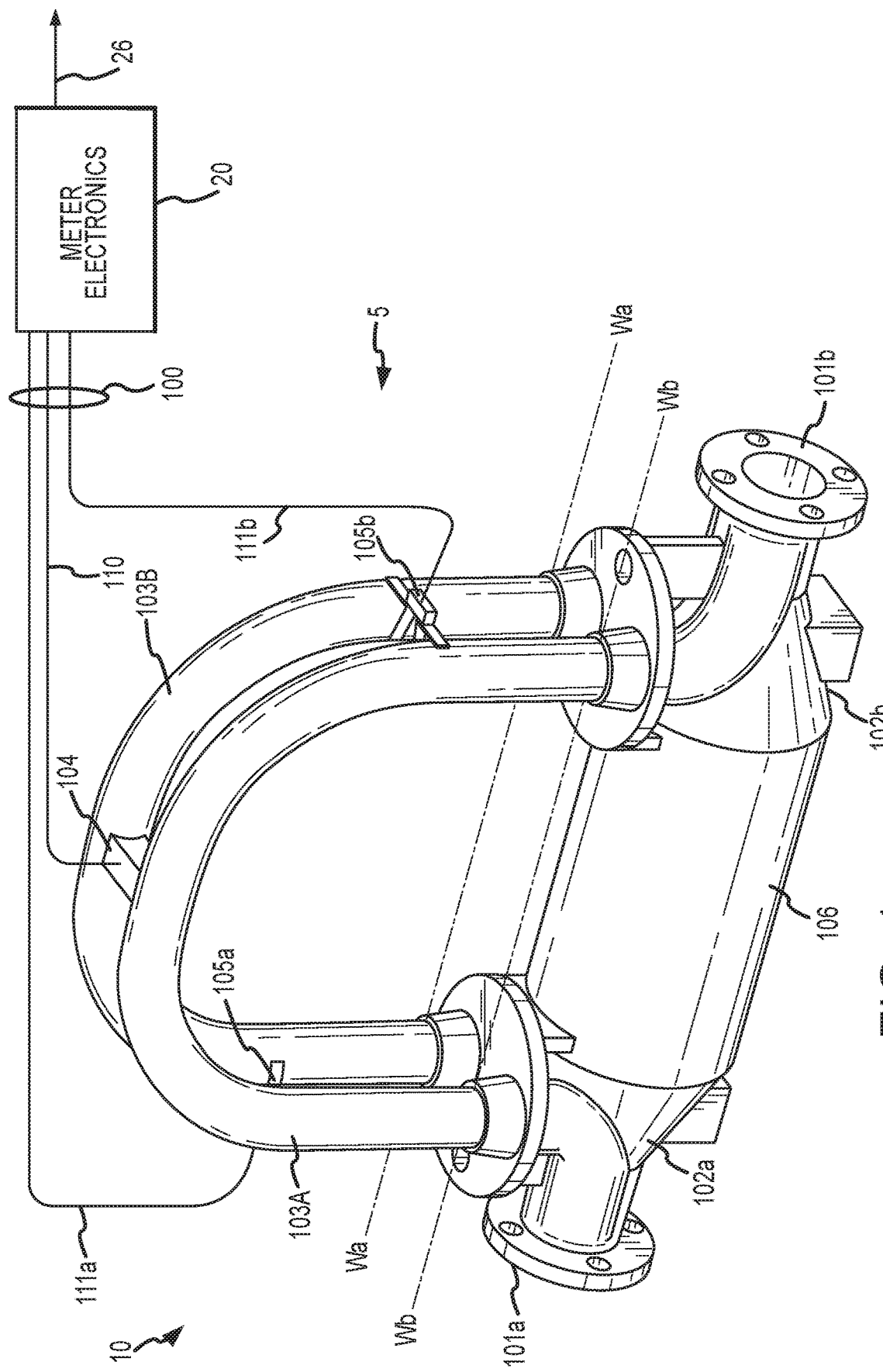
FIG. 1 shows a vibratory flowmeter according to an embodiment of the invention.

FIG. 1 shows a vibratory flowmeter 5 according to the invention. The explosion proof feedthrough described herein is contemplated for use with such a vibratory flowmeter 5. However, this is merely an example of an application for the explosion proof feedthrough, and is in no way limiting, as the explosion proof feedthrough may be utilized with any appropriate device. The vibratory flowmeter 5 comprises a flowmeter assembly 10 and meter electronics 20. The meter electronics 20 is connected to the meter assembly 10 via leads 100 and is configured to provide measurements of one or more of a density, mass flow rate, volume flow rate, totalized mass flow, temperature, or other measurements or information over a communication path 26. It should be apparent to those skilled in the art that the vibratory flowmeter 5 can comprise any manner of vibratory flowmeter, regardless of the number of drivers, pick-off sensors, flow conduits, or the operating mode of vibration. In some embodiments, the vibratory flowmeter 5 can comprise a Coriolis mass flowmeter. In addition, it should be recognized that the vibratory flowmeter 5 can alternatively comprise a vibratory densitometer.

The flowmeter assembly 10 includes a pair of flanges 101a and 101b, manifolds 102a and 102b, a driver 104, pick-off sensors 105a and 105b, and flow conduits 103A and 103B. The driver 104 and the pick-off sensors 105a and 105b are connected to the flow conduits 103A and 103B.

The flanges 101a and 101b are affixed to the manifolds 102a and 102b. The manifolds 102a and 102b can be affixed to opposite ends of a spacer 106 in some embodiments. The spacer 106 maintains the spacing between the manifolds 102a and 102b in order to prevent pipeline forces from being transmitted to flow conduits 103A and 103B. When the flowmeter assembly 10 is inserted into a pipeline (not shown) which carries the flow fluid being measured, the flow fluid enters the flowmeter assembly 10 through the flange 101a, passes through the inlet manifold 102a where the total amount of flow fluid is directed to enter the flow conduits 103A and 103B, flows through the flow conduits 103A and 103B and back into the outlet manifold 102b, where it exits the meter assembly 10 through the flange 101b.

The flow fluid can comprise a liquid. The flow fluid can comprise a gas. The flow fluid can comprise a multi-phase fluid, such as a liquid including entrained gases and/or entrained solids.

The flow conduits 103A and 103B are selected and appropriately mounted to the inlet manifold 102a and to the outlet manifold 102b so as to have substantially the same mass distribution, moments of inertia, and elastic modulus about the bending axes Wa—Wa and Wb—Wb respectively. The flow conduits 103A and 103B extend outwardly from the manifolds 102a and 102b in an essentially parallel fashion.

The flow conduits 103A and 103B are driven by the driver 104 in opposite directions about the respective bending axes Wa and Wb and at what is termed the first out of phase bending mode of the vibratory flowmeter 5. The driver 104 may comprise one of many well known arrangements, such as a magnet mounted to the flow conduit 103A and an opposing coil mounted to flow conduit 103B. An alternating current is passed through the opposing coil to cause both conduits to oscillate. A suitable drive signal is applied by the meter electronics 20 to the driver 104 via the lead 110. Other driver devices are contemplated and are within the scope of the description and claims.

The meter electronics 20 receives sensor signals on the leads 111a and 111b, respectively. The meter electronics 20 produces a drive signal on the lead 110 which causes the driver 104 to oscillate the flow conduits 103A and 103B. Other sensor devices are contemplated and are within the scope of the description and claims.

The meter electronics 20 processes the left and right velocity signals from the pick-off sensors 105a and 105b in order to compute a flow rate, among other things. The communication path 26 provides an input and an output means that allows the meter electronics 20 to interface with an operator or with other electronic systems. The description of FIG. 1 is provided merely as an example of the operation of a Coriolis flowmeter and is not intended to limit the teaching of the present invention.

The meter electronics 20 in one embodiment is configured to vibrate the flowtubes 103A and 103B. The vibration is performed by the driver 104. The meter electronics 20 further receives resulting vibrational signals from the pickoff sensors 105a and 105b. The vibrational signals comprise vibrational responses of the flowtubes 103A and 103B. The meter electronics 20 processes the vibrational responses and determines a response frequency and/or phase difference. The meter electronics 20 processes the vibrational response and determines one or more flow measurements, including a mass flow rate and/or density of the flow fluid. Other vibrational response characteristics and/or flow measurements are contemplated and are within the scope of the description and claims.

In one embodiment, the flowtubes 103A and 103B comprise substantially U-shaped flowtubes, as shown. Alternatively, in other embodiments, the flowtubes can comprise substantially straight flowtubes or can comprise one or more flowtubes of curved shapes other than U-shaped flowtubes. Additional flowmeter shapes and/or configurations can be used and are within the scope of the description and claims.

Figure 2:
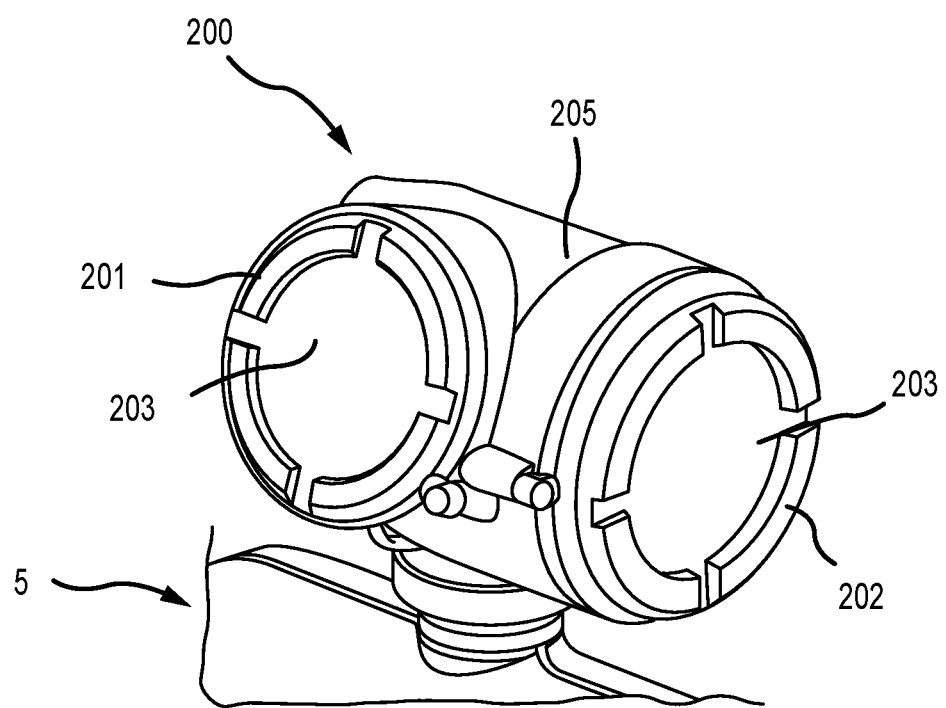
FIG. 2 illustrates an embodiment of an explosion proof electronics enclosure mounted on a portion of a flowmeter.

FIG. 2. is a view of an explosion proof electronics enclosure 200 according to an embodiment of the invention. The explosion proof electronics enclosure 200 is installed on a flowmeter 5 for illustrative purposes only, as the explosion proof electronics enclosure 200 may be utilized in any application where an explosion proof electronics enclosure 200 is contemplated. The explosion proof electronics enclosure 200 comprises a first access point 201 and a second access point 202. These access points 201, 202 provide means to access the interior spaces of the explosion proof electronics enclosure 200. In an embodiment, the access points 201, 202 may comprise cap members 203 that are secured to the body 205 of the explosion proof electronics enclosure 200. In an embodiment, at least one of the cap members may be transparent so that interior electronics and/or a display may be visible to a user.

Figure 3:
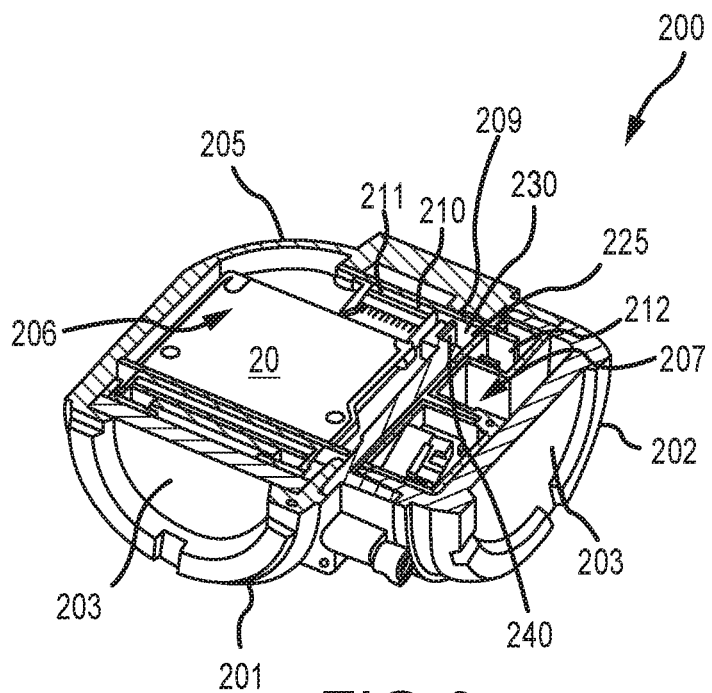
FIG. 3 is a cutaway isometric view of the explosion proof electronics enclosure of FIG. 2.
Figure 4:
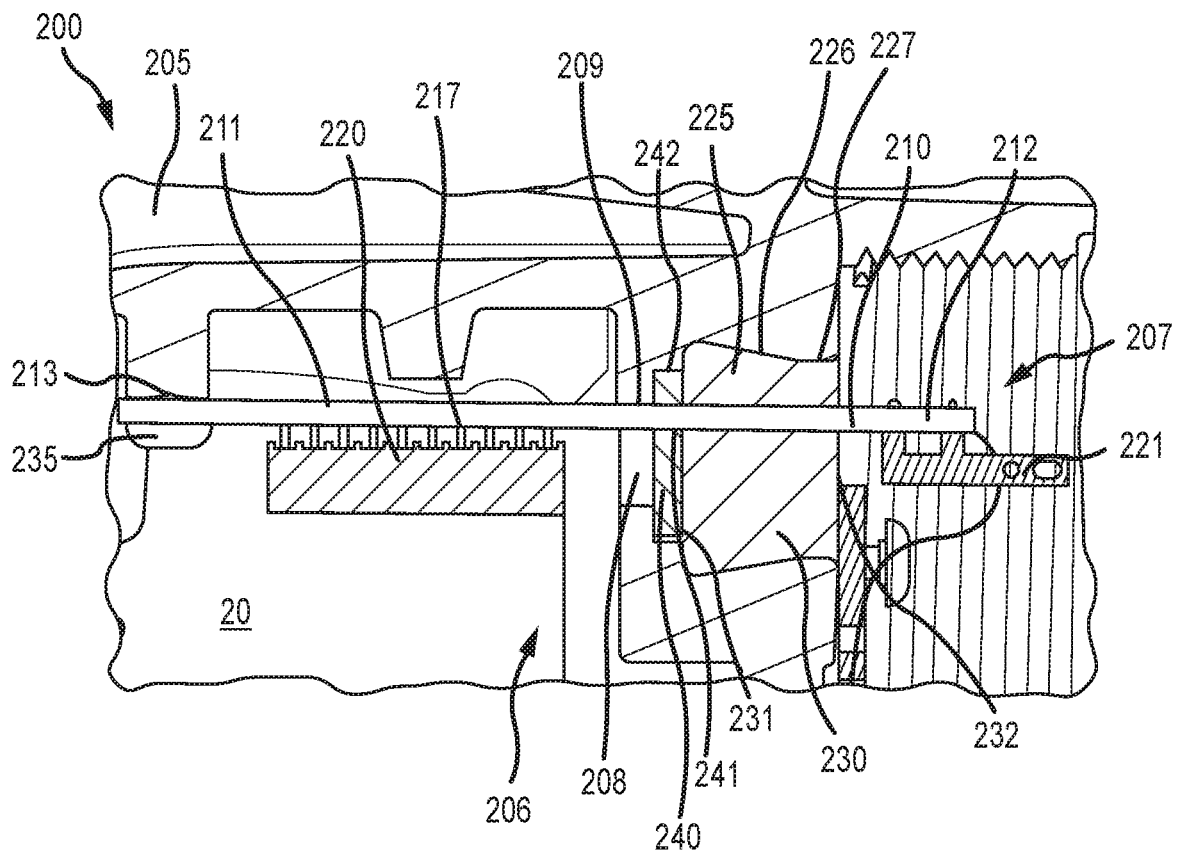
FIG. 4 illustrates a magnified cross-sectional view of the explosion proof electronics enclosure of FIG. 3.

FIG. 3 is an exploded view of the explosion proof electronics enclosure 200 according to an embodiment of the invention. FIG. 4 is a magnified view of a portion of FIG. 3. The explosion proof electronics enclosure 200 in this embodiment includes a feed-through element 210. In an embodiment, the feed-through element 210 comprises a substantially planar shape, a first interface region 211, and a second interface region 212, wherein one or more conductors 217 extend between the first interface region 211 and the second interface region 212.

The body 205 of the explosion proof electronics enclosure 200 defines a first compartment 206 and a second compartment 207. In an embodiment, meter electronics 20 or other types of electronics are disposed in the first compartment 206, while terminals and/or interfaces are disposed in the second compartment 207. A septum 208 separates the first compartment 206 and a second compartment 207.

A first aperture 209 between the first interface region 211 and the second interface region 212 allows communication between the first compartment 206 and a second compartment 207. The aperture 209 may comprise an aperture in a barrier, wall, the septum, or any other partition between the first compartment 206 and the second compartment 207.

The interface regions 211, 212 may include, define, or receive an electrical connector or other electrical component.

The first interface region 211 of the feed-through element 210 extends at least partially to the first compartment 206 of the explosion proof electronics enclosure 200. The second interface region 212 of the feed-through element 210 extends at least partially to the second compartment 207 of the explosion proof electronics enclosure 200.

The feed-through element 210 may comprise a substantially planar shape in some embodiments. However, the feed-through element 210 may be formed in any desired or needed shape. In some embodiments, the second interface region 212 may be substantially opposite the first interface region 211. However, this is not required and the second interface region 212 may be at any position/orientation with respect to the first interface region 211.

The feed-through element 210 includes one or more conductors 217 extending from the first interface region 211 to the second interface region 212. The one or more conductors 217 may comprise external conductors formed on an outer surface of the feed-through element 210. Alternatively, the one or more conductors 217 may comprise one or more internal conductors formed partially or completely within the feed-through element 210. The one or more conductors 217 may conduct electricity and/or electrical signals between the first interface region 211 and the second interface region 212.

The feed-through element 210 may comprise an electrical insulator material. The feed-through element 210 may comprise a non-flammable or flame or heat-resistant material. In some embodiments, the feed-through element 210 may comprise a printed circuit board (PCB). The one or more conductors 217 may be formed on outside surfaces of the feed-through element 210 or may be located partially or completely inside the feed-through element 210. The ends of the one or more conductors 217 at the first interface region 211 are exposed to be electrically contacted or coupled. Similarly, the ends of the one or more conductors 217 at the second interface region 212 are likewise exposed to be electrically contacted or coupled. A first electrical connector 220 (or similar device) may be assembled or affixed to the first interface region 211 and the conductors there. A second electrical connector 221 (or similar device) may be assembled or affixed to the second interface region 212 and the conductors there.

In some embodiments, the feed-through element 210 may be at least partially flexible. For example, in some embodiments the feed-through element 210 may comprise a flexible member that is similar to a ribbon cable.

The feed-through element 210 may also provide an electrical interface that provides a predetermined impedance characteristic for the one or more conductors 217. It should be understood that the impedance characteristics of individual conductors 217 may be the same or may be different. The one or more conductors 217 may be formed of predetermined thicknesses and predetermined widths. The one or more conductors 217 may be formed in predetermined geometric shapes or patterns and may include a ground plane or ground planes. The one or more conductors 217 may be formed of predetermined conductor compositions. Further, the one or more conductors 217 may be formed to have a predetermined DC resistance and/or a predetermined AC impedance. This may comprise including any manner of passive and/or active electrical components as part of either the feed-through element 210 or as part of subsequent electrical circuits. Further, in some embodiments the explosion proof electronics enclosure 200 may include interchangeable feed-through elements 210 of various impedances/resistances for use during the manufacturing process. As a result, the explosion proof electronics enclosure 200 can be assembled to comprise a desired impedance/resistance from among a plurality of possible impedances/resistances.

A cavity 225 is disposed proximate the first aperture 209. When the feed-through element 210 is installed in the explosion proof electronics enclosure 200, the feed-through element 210 passes through the first aperture 209 and the cavity 225. The cavity 225 thus opens to the first aperture 209 and to the second compartment 207.

The cavity 225 is sealed by injecting a potting material 230 therein, also surrounding and embedding the feed-through element 210 therein. The potting material 230 prevents a spark, flame, or explosion from passing between the first and second compartments 206, 207.

In some embodiments, compliance with a flame proof standard may require maintaining a small gap, a long flame path length, or both. The flame path length may be selected so that a flame may not propagate from one side of the explosion proof electronics enclosure 200 to the other side with sufficient heat or energy content to cause ignition, given a gap between the feed-through element 210 and the body 205.

In some embodiments, it is desired that gaps do not exist, as gaps may allow gasses to leak therethrough, and may allow possible gas ignition. Since gaps may allow ignition products to propagate through the joint, both the feed-through element 210 and first aperture 209 may be smooth and regular, i.e., to within a predetermined surface finish.

Potting material 230 is an epoxy, plastic, or other filling material which seals the cavity 225, thus preventing a flame or explosion from escaping through the cavity 225 or first aperture 209.

To ensure the potting material 230 is not dislodged due to the pressure related to an explosion, the cavity 225 comprises an undercut taper 226.

As part of the assembly process, the feed-through element 210 is disposed in the first aperture 209, such that the feed-through element 210 is inserted through the first aperture 209 and the cavity 225, wherein the one or more conductors 217 extend between the first interface region 211 and the second interface region 212, and wherein the first interface region 211 resides in the first compartment 206, and the second interface region 212 resides in the second compartment 207. The potting material 230 is then placed in the cavity 225, and takes the shape of the cavity 225, and is allowed to cure or harden. The feed-through element 210 is thus retained in the cavity 225 and the first aperture 209 with the potting 230.

In an embodiment, the feed-through element 210 is inserted through the first aperture 209 and the cavity 225 via the first compartment 206. In an embodiment, the feed-through element 210 is inserted through the first aperture 209 and the cavity 225 via the second compartment 207.

In an embodiment, the feed-through element 210 may be machined to a predetermined profile tolerance, wherein the junction between the feed-through element 210 and the first aperture 209 mates with sufficient precision to create a substantially explosion proof interface. For example, the feed-through element 210 may be manufactured to be thicker than desired and then the feed-through element 210 may be planed, milled, etched, ground, or otherwise processed until the explosion proof electronics enclosure 200 comprises a junction between the feed-through element 210 and the first aperture 209 having a desired size and shape and desired uniformity. The feed-through element 210 and/or the first aperture 209 may be manufactured to achieve one or more of a predetermined perimeter size, a predetermined perimeter shape, and/or a predetermined perimeter surface smoothness and/or uniformity. In an embodiment, the feed-through element 210 overlaps the first aperture 209 completely on one of the sides of the first aperture 209, with no portions of the aperture remaining uncovered, such that the feed-through element 210 acts as a stop to achieve a predetermined position in the first aperture 209.

The undercut taper 226 is provided such that when the potting material 230 cures or hardens, the potting material 230 is permanently placed. The undercut taper 226 results in a potting material 230 plug with a lower region 231 having a larger area than the opening 232 of the cavity 225. Therefore, upon explosive forces, the potting material 230 is trapped in the cavity 225, which results in an explosion proof junction between the first compartment 206 and second compartment 207.

The undercut taper 226 may be provided having a dovetailed shape with a flat region 227 proximate the opening 232 of the cavity 225, as is shown in FIG. 4. In another embodiment, the undercut taper 226 may be provided having a frustoconical shape with no flat region 227 proximate the opening 232 of the cavity 225. The angle of the undercut may be between about 10° and 50°. Preferably, the angle of the undercut is between about 15° and 25°. In FIG. 4, the angle of the undercut is illustrated as being approximately 20°, though this is merely an example of an embodiment.

In an embodiment, a support plate 240 is provided having a second aperture 241 therein. The support plate 240 is ultimately disposed proximate the first aperture 209, at the bottom of the cavity 225. In an embodiment, the potting material 230 is then introduced to the cavity 225, and the support plate 240 is lowered into the cavity 225. The support plate 240 acts as a dam to contain the potting material 230 as it cures or hardens. The support plate 240 also aids to keep the feed-through element 210 properly located during the curing or hardening process. The support plate 240 may simply fit into the bottom of the cavity 225, or may be disposed in a recess 242 proximate the bottom of the cavity 225, wherein the recess is a size and dimension to receive the support plate 240.

In an embodiment, the support plate 240 is placed in the cavity 225, and then the feed-through element 210 is passed through the cavity 225, second aperture 241, and the first aperture 209. In an embodiment, the feed-through element 210 is first passed through the second aperture 241, and then the support plate 240 and feed-through element 210 are subsequently placed into the cavity 225.

In some embodiments, the explosion proof electronics enclosure 200 may additionally include a seal or seals (not shown) between any portion of the body and the feed-through element 210. The seal or seals may comprise a solid seal or seals, such as O-rings, gaskets, or other components that may be disposed between other components. Alternatively, the seal or seals may comprise a liquid, paste, grease, or other material that does not have a predetermined shape and that can be applied to one or more of the components of the explosion proof electronics enclosure 200. The seal or seals may comprise a material that does not substantially change. Alternatively, the seal or seals may comprise a material that hardens, cures, or otherwise transforms or is transformed during or after the assembly process.

In an embodiment, the feed-through element 210 may receive one or more fasteners 235 that fasten the feed-through element 210 to the body 205 or other portion of the explosion proof electronics enclosure 200. In a related embodiment, the feed-through element 210 may include one or more fastener apertures 213. The one or more fastener apertures 213 may receive electrical conductors of any manner or may receive a connector or other component. The one or more fastener apertures 213 may include any manner of pads, through-plating, or other conductor coupling feature.

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part to create additional embodiments within the scope and teachings of the invention. Accordingly, the scope of the invention should be determined from the following claims.

What is claimed is:

1. An explosion proof electronics enclosure, comprising: a first compartment defined by a body; a second compartment defined by the body; a septum between the first compartment and the second compartment; a first aperture with the septum that connects the first compartment and the second compartment; a cavity in communication with the first aperture, wherein the cavity comprises an undercut taper; and a potting (238) with the cavity that conforms to the cavity shape, and forms a substantially explosion-proof interface between the first compartment and the second compartment.

2. The explosion proof electronics enclosure of claim 1, comprising: a feed-through element comprising a first interface region and a second interface region, wherein one or more conductors extend between the first interface region and the second interface region, and wherein the first interface region resides in the first compartment, and the second interface region resides in the second compartment; and wherein the potting retains the feed-through element in the cavity and the first aperture.

3. The explosion proof electronics enclosure of claim 2, wherein the feed-through element comprises a printed circuit board.

4. The explosion proof electronics enclosure of claim 1, wherein a cross section of the cavity comprises a dovetail shape.

5. The explosion proof electronics enclosure of claim 1, wherein a cross section of the cavity comprises a frustoconical shape.

6. The explosion proof electronics enclosure of claim 1, comprising a support plate disposed in the cavity, wherein the support plate comprises a second aperture therein, and wherein the support plate aids retaining the potting during an explosion.

7. The explosion proof electronics enclosure of claim 6, wherein the support plate is configured to maintain a feed-through element in a predetermined position in the first aperture and cavity.

8. The explosion proof electronics enclosure of claim 1, wherein a cross section of the undercut comprises an undercut angle between 150 and 250.

9. A method of forming an explosion proof electronics enclosure, with the method comprising: providing a feed-through body comprising a first compartment and a second compartment; separating the first compartment and the second compartment with a septum; placing a first aperture in the septum that connects the first compartment and the second compartment; providing a cavity in communication with the first aperture, wherein the cavity comprises an undercut taper, and wherein a maximally undercut portion of the undercut taper is proximate the first compartment; and placing potting in the cavity, such that the potting conforms to the cavity shape, and forms a substantially explosion-proof interface between the first compartment and the second compartment.

10. The method of forming an explosion proof electronics enclosure of claim 9, comprising: inserting a feed-through element through the first aperture and cavity, wherein the feed-through element comprises a first interface region and a second interface region, wherein one or more conductors extend between the first interface region and the second interface region, and wherein the first interface region resides in the first compartment, and the second interface region resides in the second compartment; and retaining the feed-through element in the cavity and the first aperture with the potting.

11. The method of forming an explosion proof electronics enclosure of claim 9, comprising shaping a cross section of the cavity to comprise a dovetail shape.

12. The method of forming an explosion proof electronics enclosure of claim 9, comprising shaping a cross section of the cavity to comprise a frustoconical shape.

13. The method of forming an explosion proof electronics enclosure of claim 9, comprising: forming a second aperture in a support plate; and placing the support plate in the cavity, wherein the support plate aids retaining the potting during an explosion.

14. The method of forming an explosion proof electronics enclosure of claim 13, comprising the steps of: installing a feed-through element through the second aperture of the support plate; and maintaining a feed-through element in a predetermined position in the first aperture and cavity with the support plate.

15. The method of forming an explosion proof electronics enclosure of claim 14, wherein the feed-through element is installed through the second compartment.

* * * * *